(12) United States Patent
Beatty et al.

(10) Patent No.: US 7,195,479 B2
(45) Date of Patent: Mar. 27, 2007

(54) HOT LINER INSERTION/REMOVAL FIXTURE

(75) Inventors: James Hoyt Beatty, Rockwall, TX (US); Chris Whitesell, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 78 days.

(21) Appl. No.: 10/754,521

(22) Filed: Jan. 8, 2004

(65) Prior Publication Data

US 2004/0146827 A1    Jul. 29, 2004

Related U.S. Application Data

(62) Division of application No. 10/337,150, filed on Jan. 6, 2003, now Pat. No. 6,692,249.

(51) Int. Cl.
*F27D 3/12* (2006.01)
*F27D 1/00* (2006.01)
*C21B 7/06* (2006.01)
*C21C 5/44* (2006.01)

(52) U.S. Cl. .................... 432/3; 432/248; 432/264; 266/281; 266/DIG. 1; 373/137; 373/155; 373/164

(58) Field of Classification Search ............ 432/3, 432/242, 247, 248, 264; 266/DIG. 1, 281, 266/193; 373/71, 72, 75, 137, 155, 164
See application file for complete search history.

(56) References Cited

U.S. PATENT DOCUMENTS

| | | | | |
|---|---|---|---|---|
| 4,287,839 A | * | 9/1981 | Severin et al. | 373/137 |
| 4,573,431 A | * | 3/1986 | Sarkozy | 118/725 |
| 5,332,200 A | * | 7/1994 | Gorin et al. | 266/280 |
| 5,547,512 A | * | 8/1996 | Gabor et al. | 118/718 |
| 5,835,525 A | * | 11/1998 | Thomas | 373/137 |
| 6,692,249 B1 | * | 2/2004 | Beatty et al. | 432/248 |
| 6,698,493 B2 | * | 3/2004 | Graham | 164/122.1 |

* cited by examiner

*Primary Examiner*—Jiping Lu
(74) *Attorney, Agent, or Firm*—Jacqueline J. Garner; W. James Brady, III; Frederick J. Telecky, Jr.

(57) ABSTRACT

A fixture (30) adapted to permit the heated exchange of a liner (14) from an operating vertical furnace (10). The fixture is adapted to secure to the base of the liner (14) to both unlock and lower the heated liner, such as a silicon carbide liner, at an controlled rate. The fixture is also adapted to elevate a new liner into the operating vertical furnace at a controlled rate to control the rate of heating of the liner as it is inserted into the operating vertical furnace. The fixture includes an inner ring (34), a low-friction Teflon® ring (36), and an outer ring (38) permitting the rotation of the inner ring within the outer ring. Advantageously, the low friction ring comprises a flanged portion and a vertical portion allowing rotation of the inner ring within the outer ring even when elevated at extreme temperatures exceeding 500° C.

13 Claims, 8 Drawing Sheets

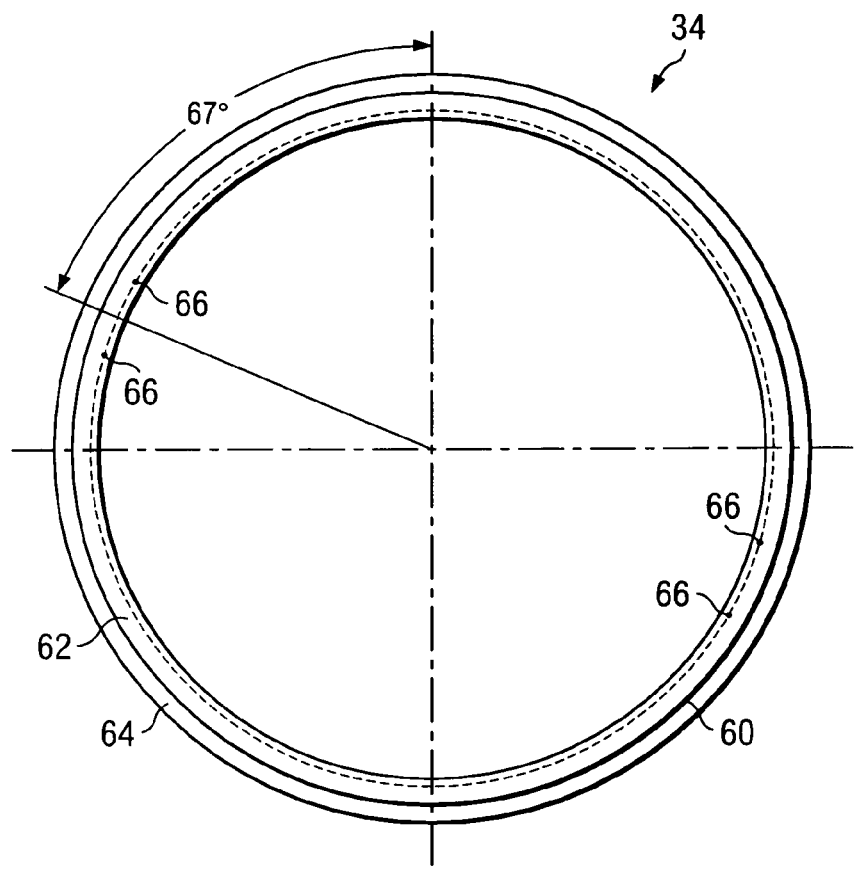
FIG. 8
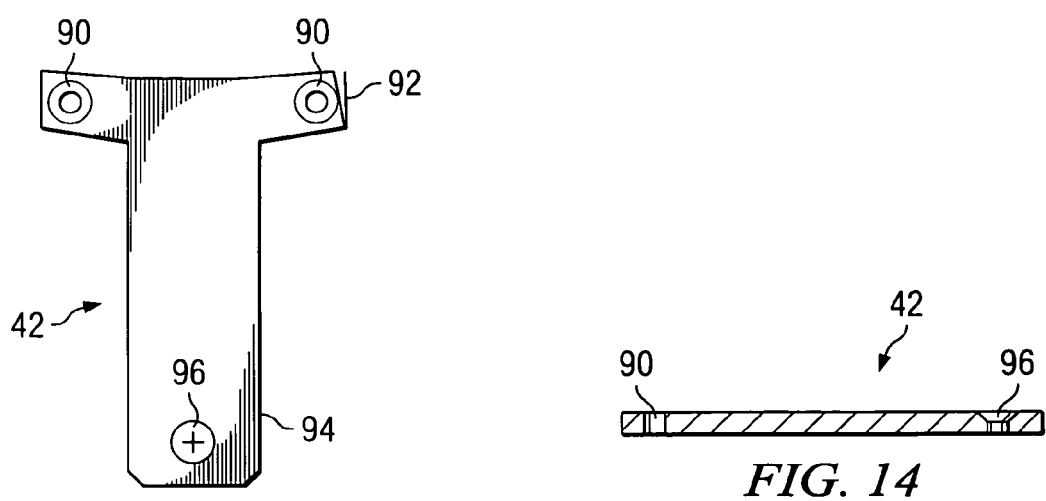
FIG. 13
FIG. 14

HOT LINER INSERTION/REMOVAL FIXTURE

This is a divisional application of Ser. No. 10/337,150 filed Jan. 6, 2003 now U.S. Pat. No. 6,692,249.

FIELD OF THE INVENTION

The present invention is generally related to thermal processing furnaces for processing semiconductor wafers, and particularly to a vertical-type processing furnace including vertical nitride furnaces.

BACKGROUND OF THE INVENTION

Thermal processing furnaces, also known as diffusion furnaces, have been widely known and used for many years to perform a variety of semiconductor fabrication processes, including annealing, diffusion, oxidation, and chemical vapor deposition (CVD). As a result, these processes are well understood, especially with regard to the impact of process variables on the quality and uniformity of resulting products.

Thermal processing furnaces typically employ either a horizontal-type furnace, or a vertical-type furnace. For some applications, vertical-type furnaces are preferred because they create less particles during use, thus decreasing the incidence of contamination and wafer waste. In addition, they can be easily automated, and they require less floor space because of their relatively small footprint.

Both conventional types of diffusion furnaces are designed to heat semiconductor wafers to desired temperatures to promote either diffusion of the dopants to a desired depth while maintaining line width smaller than 1 micron, as known, or to perform other conventional processing techniques such as the application of an oxide layer to the wafer or deposition of a chemical vapor layer to the wafer. The heating requirements of the wafer during processing are known and well understood, and thus are closely monitored.

Conventional vertical-type thermal processing furnaces are designed to support the outer tube and inner tube within the furnace in the vertical position. The inner tube is conventionally referred to as a liner, and typical liners include silicon carbide liners which operate above 500° Celsius, such as in the TEL a-303i Vertical Nitride Furnace. Although the silicon carbide liners are designed to operate at temperatures above 500° Celsius, the current fixtures provided by manufactures for replacing the silicon carbide liners are designed for use at room temperature. Unfortunately, to achieve room temperatures the entire furnace must be inactivated and cooled, which is an exceptionally expensive process. Every time a furnace is brought offline to room temperature, numerous expensive parts need to be serviced and/or replaced before the vertical furnace can be heated again and brought back online. For instance, the inner thermalcouple (TC) needs to be replaced as it is usually contaminated with a nitride film which degrades operational properties and necessitates requalification. This part alone may cost $7,000.00, excluding labor. In addition, a stainless steel manifold and O ring needs to be replaced, which is usually contaminated with ammonia chloride. A fair estimate for bringing a vertical furnace offline and then again back online, such as to replace the silicon carbide liner may cost in excess of $30,000.00

A silicon carbide liner will eventually generate particles in excess of a maximum allowable particle count after a predetermined time, such as a thickness of 3.5 microns, and needs to be replaced. However, the entire furnace does not need to be retrofitted as often, but is conventionally brought offline to provide for the replacement of the silicon carbide liner since the removal fixtures are only designed by the manufacture to operate at room temperature.

Accordingly, there is a need to provide for the retrofitting of a silicon carbide liner within an operating heated vertical furnace, including the installation and removal of the liner from the operating heated semiconductor vertical furnace without causing damage to either the old or new liner, or the furnace itself. Such a solution would significantly reduce the overall operating cost of the vertical furnace by allowing the retrofitting of the silicon carbide liner itself without bringing the furnace offline.

SUMMARY OF THE INVENTION

The present invention achieves technical advantages as an liner exchange fixture having a low-friction member and method of operation adapted to permit the retrofitting of a silicon carbide liner in an operating heated semiconductor vertical furnace. The present invention includes an exchange fixture adapted to operate while heated, such as above 500° Celsius, and also at room temperature if desired. The exchange fixture can be maneuvered proximate the operating furnace to unlock the liner and lower the liner therefrom at a controlled descent rate to control the cooling rate of the liner from its normal operating temperature. The fixture is also adapted to insert a new liner into the operating furnace at a controlled rate such that the liner is brought up to an operating temperature at a controlled rate to prevent damage thereto. Thus, the film integrity on the remaining operating furnace parts are maintained.

In one preferred embodiment, the exchange fixture comprises an outer ring, and an inner ring residing within the outer ring and adapted to support the liner when elevated to the operating vertical furnace, and when the liner is removed and inserted from/into the operating vertical furnace. The inner ring includes structure adapted to facilitate rotation of the inner ring between a locked position when the liner is elevated in the operating vertical furnace, and an unlocked position when the liner is to be lowered from the operating vertical furnace. Advantageously, the low-friction member is flanged and interposed between and interfacing the inner ring and the outer ring along 2 surfaces, thus facilitating the ease of rotation of the inner ring within the outer ring when the inner ring is both heated proximate the furnace and when lowered from the operating vertical furnace, including at room temperature. This low-friction member accommodates the expansion and contraction of the inner ring within the outer ring due to the heating and cooling cycles of the inner ring when disposed proximate the furnace or when removing the liner from the operating furnace.

An elevator is adapted to support the outer ring for lowering the liner from the operating furnace, and also for elevating the exchange fixture such that the liner is raised into the operating furnace. The first ring includes at least one handle, and preferably two opposing handles, adapted to facilitate rotation of the inner ring within the outer ring along the low friction member when the liner is positioned in the operating vertical furnace.

Each handle has at least two securing points coupled to the inner ring, wherein each handle is uniquely secured at two securing points separated a predetermined actuate distance from one another. Each handle has a lever point radially separated from the inner ring along an axis extending between the two securing points to form a "T" relationship relative to the two securing points.

Advantageously, the elevator is adapted to lower the fixture and the supported old liner from the operating furnace at a rate below a predetermined maximum rate to control the rate of temperature decrease of the liner when removed from the operating vertical furnace. Likewise, the elevator is also adapted to elevate the new liner into the operating vertical furnace at a rate below a predetermined maximum rate to control the rate of temperature increase of the liner when inserted into the operating vertical furnace. This controlled ascent and descent rate prevents damage to the old and new liner as it is cooled or brought up to operating temperature.

BRIEF DESCRIPTION OF THE DRAWINGS

FIG. 8 is a bottom view of the inner ring depicting the lower extending annular member and flange surface adapted to rest upon the low-friction ring and within the outer ring, as well as the two mounting threaded holes receiving the handles;

FIG. 13 is a top view of one of the two handles coupled to the inner ring to permit rotation of the inner ring with respect to the outer ring when heated and also when cooled; and FIG. 14 is a side view of the handle of FIG. 13.

DETAILED DESCRIPTION OF THE PREFERRED EMBODIMENT

Figure 1:
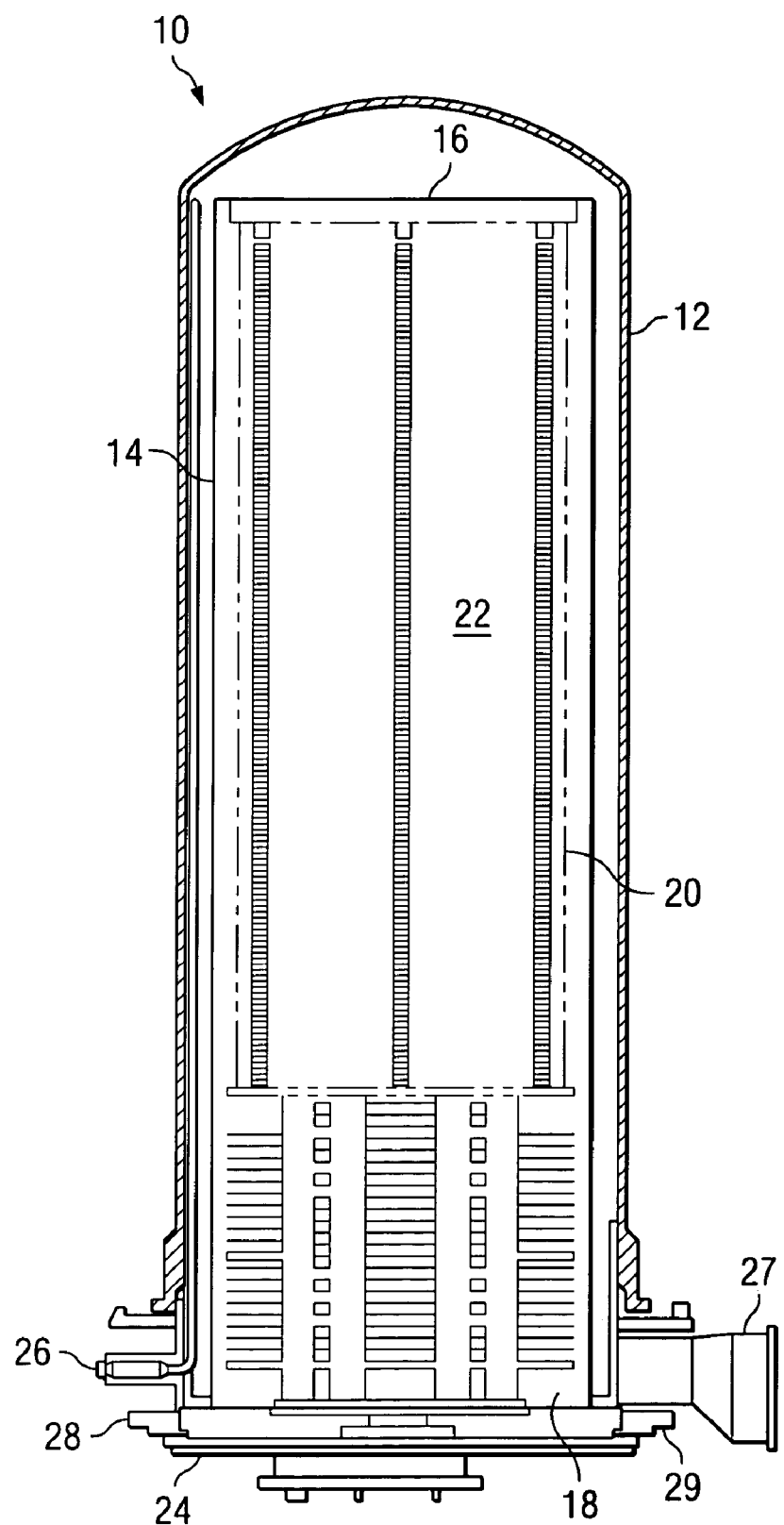
FIG. 1 is a side sectional view of a conventional vertical furnace having a silicon carbide liner and a boat assembly for holding semiconductor wafers residing therein.

Referring now to FIG. 1, there is generally shown at 10 a side sectional view of a vertical-type thermal processing furnace 10. The thermal processing furnace is designed to be compact and have a relatively small footprint. The furnace is typically used to perform a variety of semi-conductor fabrication processes, including annealing, diffusion, oxidation and low and high pressure chemical vapor deposition (CVD).

The thermal processing furnace 10 includes a main outer housing or outer tube 12. The vertical furnace 10 includes a cylindrical process inner tube 14 that has an upper open end 16 and an opposed open end 18. The process tube 14 can be formed of any high temperature material such as alumina, silicon carbide, quartz, and other ceramic materials, and is preferably composed of silicon carbide or quartz. The main outer housing or outer tube is surrounded by a suitable heating element (not shown), that uses resistance-heated elements or RF heated black body cavity susceptors as the primary heat source. This particular type of heat source is simple to implement, well characterized and widely accepted as a reliable technique for stable and uniform control of the furnace temperature. The heating elements can be composed of low mask, high temperature metallic wires. The insulation surrounding the heating element can be composed of ceramic fibers of high insulation value and low thermal mass. All are designed for fast responses to temperature changes. The furnace can also include an air cooling system to help cool the heating chamber if desired. The process tube diameter, and thus the size of the vertical furnace, can be easily scaled to accommodate wafers of varying sizes. As shown in FIG. 1, a wafer boat 20 is selectively disposed in the furnace 10 and is slotted to accommodate a selected number of semiconductor wafers when disposed within the inner tube compartment 22. These wafers can be unprocessed or processed wafers. Ports 26, 27, 28 and 29 provide various functions. Port 26 is the location for the inner thermocouple, which coupled with the spike thermocouples (not show) are responsible for temperature monitoring of the vertical furnace. Port 27 is the manifold exhaust mouth from which all gases are exhausted out of the vertical furnace. Ports 28 and 29 are the ports for the ultra-torr fittings, where the gas injectors are placed. The number and location of injector ports vary by process requirements and tool configuration.

The heating element is arranged about the outer tube 10 to heat the inside of the liner to a predetermined temperature, eg. 400° C. to 1200° C. in the case of low pressure chemical vapor deposition (LPCVD), or 800° C. to 1200° C. in the case of oxidation or diffusion. A control unit (not shown) is used to regulate the temperature of the liner 14 according to the exigencies of the processing technique. For example, according to one practice, a temperature sensor, such as an optical pyrometer can be used to sense the chamber temperature and can be linked to the control unit. The heating unit preferably forms an isothermal heating zone within the liner 14, as is known in the art. As shown in FIG. 1, the wafer boat 20 is supported by a heat insulating stanchion 24. The bottom portion of the wafer support assembly has an integrally formed and radially outwardly extending flange plate, as shown, and is coupled to a boat elevator (not shown) for inserting and removing the wafer boat 20 within the liner 14 for processing. The wafer support assembly 20 is thus selectively vertically movable along the vertical axis to selectively move the wafer support assembly into and out of the furnace heating chamber 22.

After an extended operating time, the liner 14 will start to release particles that exceed processing limits established for the particular processing being performed on the semiconductor wafers. Conventionally, the entire furnace is shut down, allowing the whole unit to cool before removing and replacing the liner 14. As previously mentioned in the Background of the Invention, this entire shutdown is a considerable expense as many parts then need to be replaced and cleaned, and leads to a significant downtime of the furnace which reduces the efficiency of the entire processing since the furnace is offline for an extended period of time.

Figure 2:
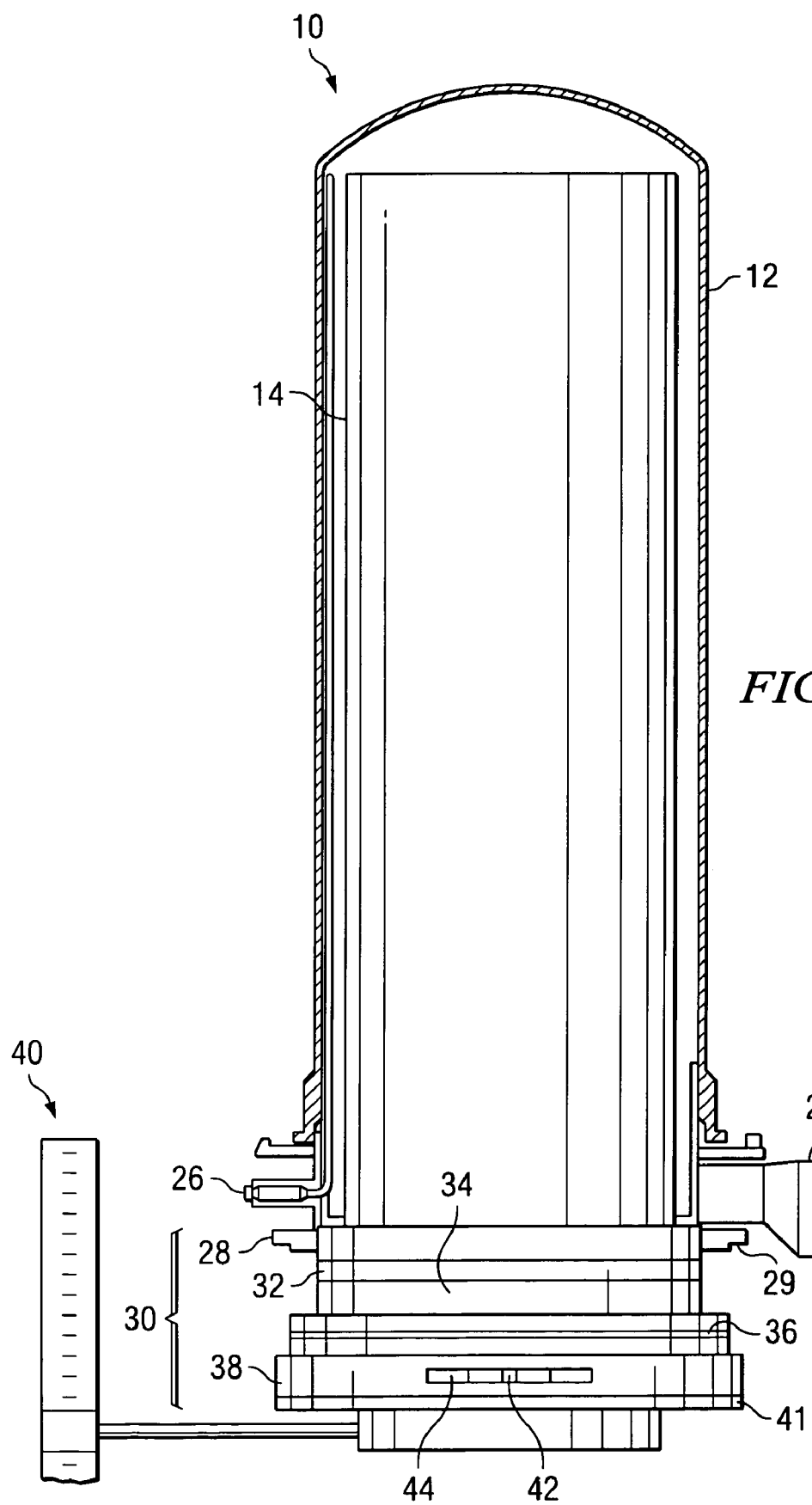
FIG. 2 is a side sectional view of the furnace with the boat assembly removed therefrom, and an exchange fixture according to the present invention coupled to and supporting the lower end of the liner prior to removal of the liner from the operating furnace.

Referring now to FIG. 2, according to the present invention, there is provided an exchange fixture adapted to permit the quick exchanging of the liner 14 within the operating vertical furnace. Advantageously, the furnace remains fully operational at a temperature exceeding 500° C., and other components do not need to be replaced, such as the remaining quartzware and associated hardware. Specifically, by maintaining the furnace operating temperature the films defined on the various interior parts that would otherwise be subject to stress fractures associated with film stress are maintained to allow for additional processing.

Again, conventionally, the liner is not adapted to be removed from a heated furnace with any of the fixtures provided by the manufacturers. The present invention permits the exchange of the liner from an operating vertical furnace using a fixture adapted to perform this operation, and the careful control of the exchange by controlling the descent rate of the old liner from the operating furnace, and the ascent rate of the new liner into the operating vertical furnace at controlled speeds to avoid quick heating and quick cooling which could damage the liner and possibly other elements of the operating furnace.

Figure 3:
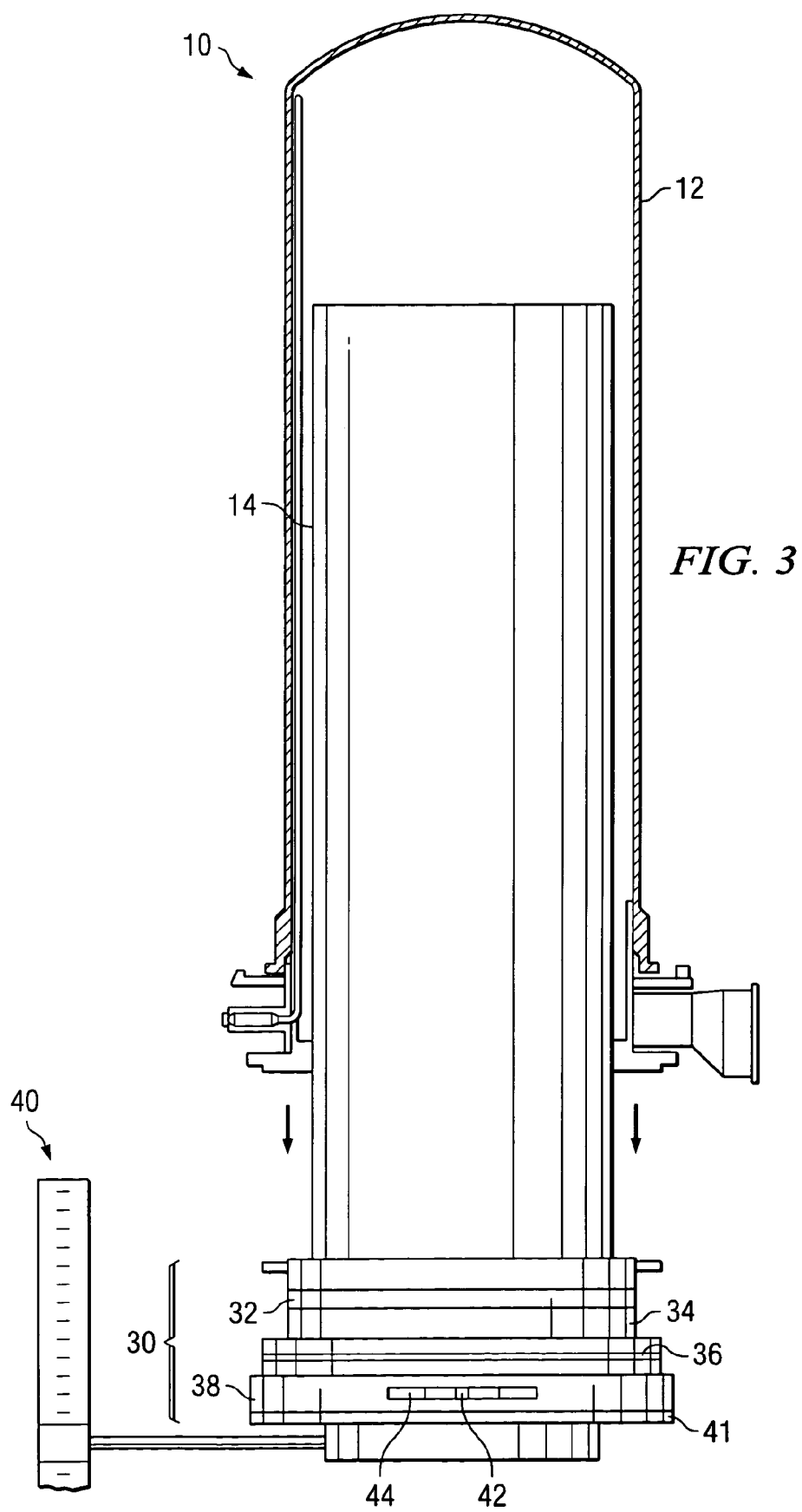
FIG. 3 is a side sectional view of the liner being removed from a heated operating vertical furnace by the exchange fixture and the elevator.

As shown in FIG. 3, a fixture generally shown at 30 according to the present invention is seen to be selectively coupled to the bottom of the liner 14 via a support ring 32 and secured thereto through a selectable locking arrangement. The key components of liner 30 include an inner ring 34, a low friction ring 36, preferably comprised of Teflon®, and an outer ring 38, wherein the low friction ring 36 permits the rotation of the inner ring therewithin when heated or cooled as it supports the liner 14. When it is desired to exchange the liner 14 from the operating furnace 10, the fixture 30 is raised by a support 41 of elevator 40 such that the lower ring 34 is coupled via the liner support ring 32 to the flanged bottom of liner 14, as shown. The inner liner 34 is then rotated by rotating handles 42 extending through a slot 44 defined in the outer ring 38 to lock the liner 14 into the steel manifold of the operating vertical furnace 10. Specifically, the liner 14 is conventionally, supported by the liner support ring 32, which is provided with tabs by the manufacture to lock and unlock the liner 14 upon rotation thereof to the steel manifold and inside of the outer tube 10.

One technical feature of the present invention is the inclusion of the flanged low friction member 36 which is structured to provide a two dimensional interface between the inner ring 34 and the outer ring 38. Specifically, the low friction ring 36 is flanged such that it interfaces the horizontal arcuate surfaces of the inner ring 34 and the outer ring 38 as the inner ring 34 supported thereon, and importantly, interfaces the vertical arcuate surfaces of the inner ring outer surface and the outer ring inner surface. The interface of the inner ring outer walls and the outer ring inner wall is important due to the fact that when the fixture 30 is proximate to operating furnace 10 and hot liner 14 is removed from an operating heated furnace 10, the exceeding high temperatures, typically being greater than 500° C., cause these rings to expand and otherwise would tend to bind due to the friction generated therebetween, even if the material of each ring is the same. The present invention is adapted to allow the rotation and removal of the liner 14 when heated, which is not contemplated for by the manufacture of the furnace. A metal on metal surface would not be adequate and would tend to bind, especially with the tight tolerances that are maintained, and due to the significant weight of the liner 14 itself.

Figure 4:
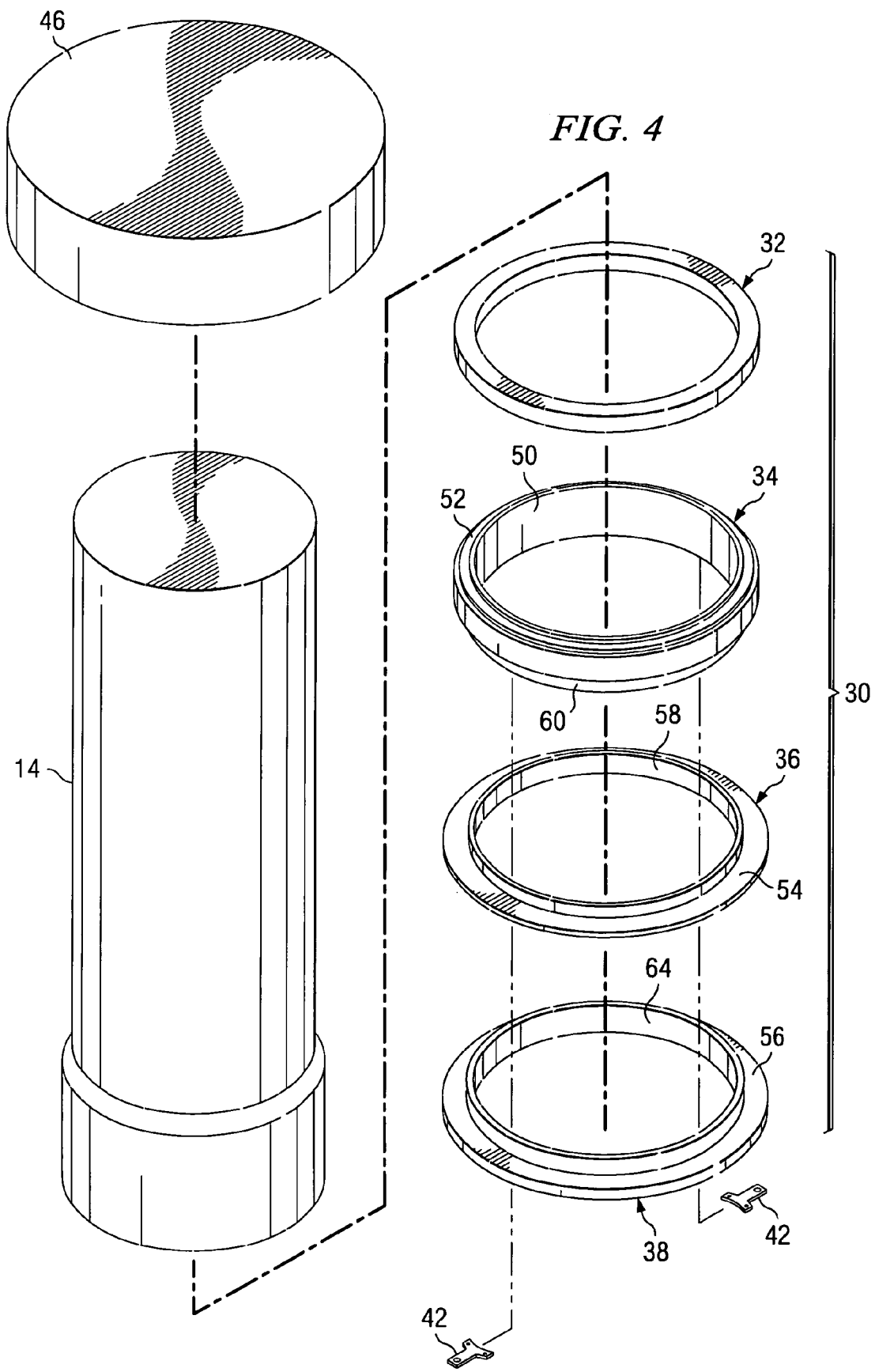
FIG. 4 is an exploded view of the exchange fixture with respect to the liner and the associated cap thereover.

Referring now to FIG. 4, there is shown an exploded view of the fixture 30 of the present invention including the inner ring 34, the flanged Teflon® low-friction ring 36, and the outer ring 38. The support ring 32 is not part of the fixture 30, but is utilized with the fixture 30 to provide the interface between the liner 14 and the fixture 30. As can be appreciated in FIG. 4, the inner ring 34 has a lower annular flanged portion 50 adapted to be supported upon the upper laterally extending flanged surface of the low friction ring 36. The liner support 32 is adapted to be supported on an annular top surface 52 of inner ring 34 and is sandwiched against the lower annular surface of liner 14. As shown, a laterally extending flange 54 of low friction ring 36 rests upon a top flanged surface 56 of outer ring 38, and also has a downwardly extending portion 58 which is disposed between an outer annular surface 60 of the downwardly extending portion 62 of inner ring 34 and an inner annular surface 64 of the outer ring 38.

Figure 5:
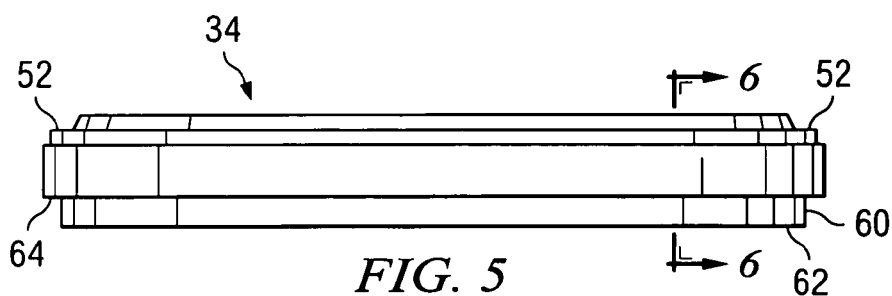
FIG. 5 is a front view of the inner ring which is adapted to couple to and support the liner during lowering and elevation of the liner into the heated operating furnace.

Referring now to FIG. 5, there is shown a front view of the inner ring 34 having the downwardly extending portion 62, and the upper annular supporting surface 52 which is flanged and inwardly tapered to permit the friction fit coupling of the liner support ring 32 thereupon. During use, the liner support ring 32 is disposed upon this upper annular surface 52 and interfaces to the annular bottom surface of the liner 14. The downwardly extending outer surface 60 of portion 62 is securingly and coaxially received within the low friction ring 36, such that a flange portion 64 extends over flange 54 of ring 36, and the outer surface 60 extends within and securingly interfaces an inner surface 66 of ring 36.

Figure 6:
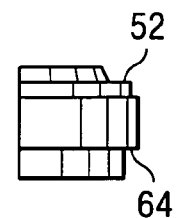
FIG. 6 is a blown up view taken along lines 6—6 in FIG. 5.

Referring to FIG. 6, there is shown in a blown up view of the flange 52 and the flange portion 64 previously described.

Figure 7:
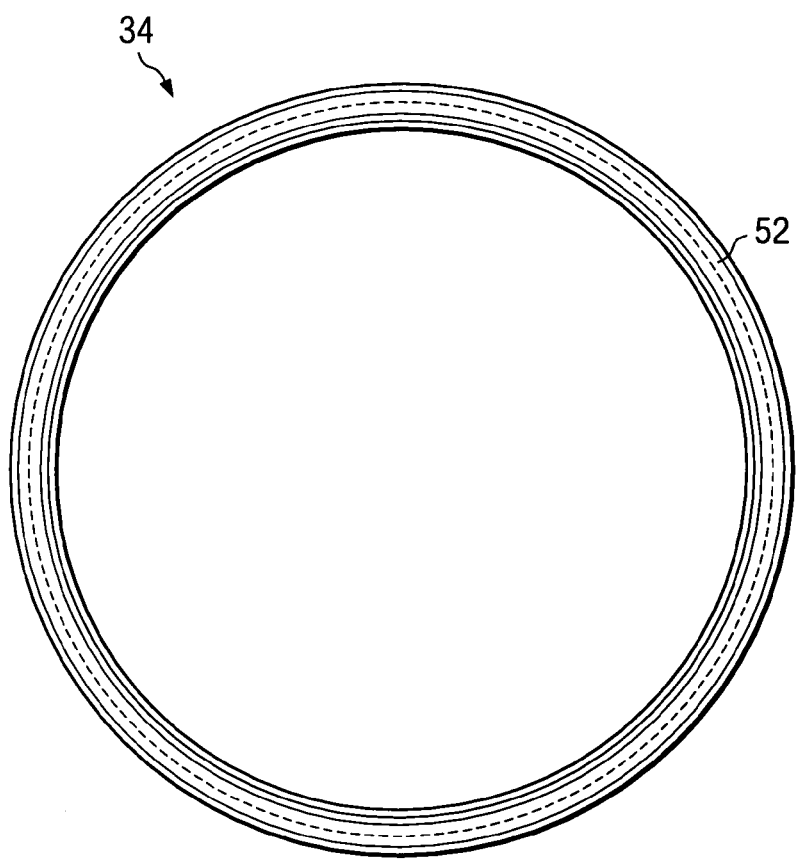
FIG. 7 is a top view of the flanged inner ring depicting the top supporting surface adapted to support the liner.

Referring to FIG. 7, there is shown a top view of the inner ring 34, and FIG. 8 illustrates a bottom view of the inner ring 34. In FIG. 8, there is further shown two sets of two threaded openings 66 that are adapted to permit the coupling of the respective handles 42 thereto to provide a leverage point and allow the rotation of the inner ring 34 within the outer ring 38 as previously described. The arcuate separation of openings 66 is approximately 14° to separate the torque points along the inner ring and prevent damage thereto.

Figure 9:
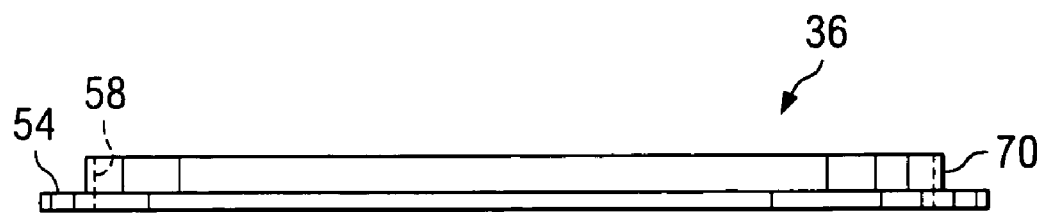
FIG. 9 is a front view of the low-friction ring, shown upside down, including the vertical annular interface and the annular flange interface each adapted to provide a low friction interface between the inner ring and the outer ring.

Referring now to FIG. 9, there is a front view of the low friction ring 36, shown upside down from the assembled view in FIG. 2, FIG. 3, and the exploded view of FIG. 4. The low-friction ring 36 is seen to have the flanged portion 54 and the arcuate sidewall portion 58 having an outer sidewall 70. The thickness of the flanged portion 54 is preferably 3 mm, and the thickness of the arcuate outer wall 58 is preferably 3 mm. These two surfaces 54 and 70 each provide a low friction interface between the inner ring 34 and the outer ring 38, especially when they are heated due to the operating temperature of the vertical furnace.

Figure 10:
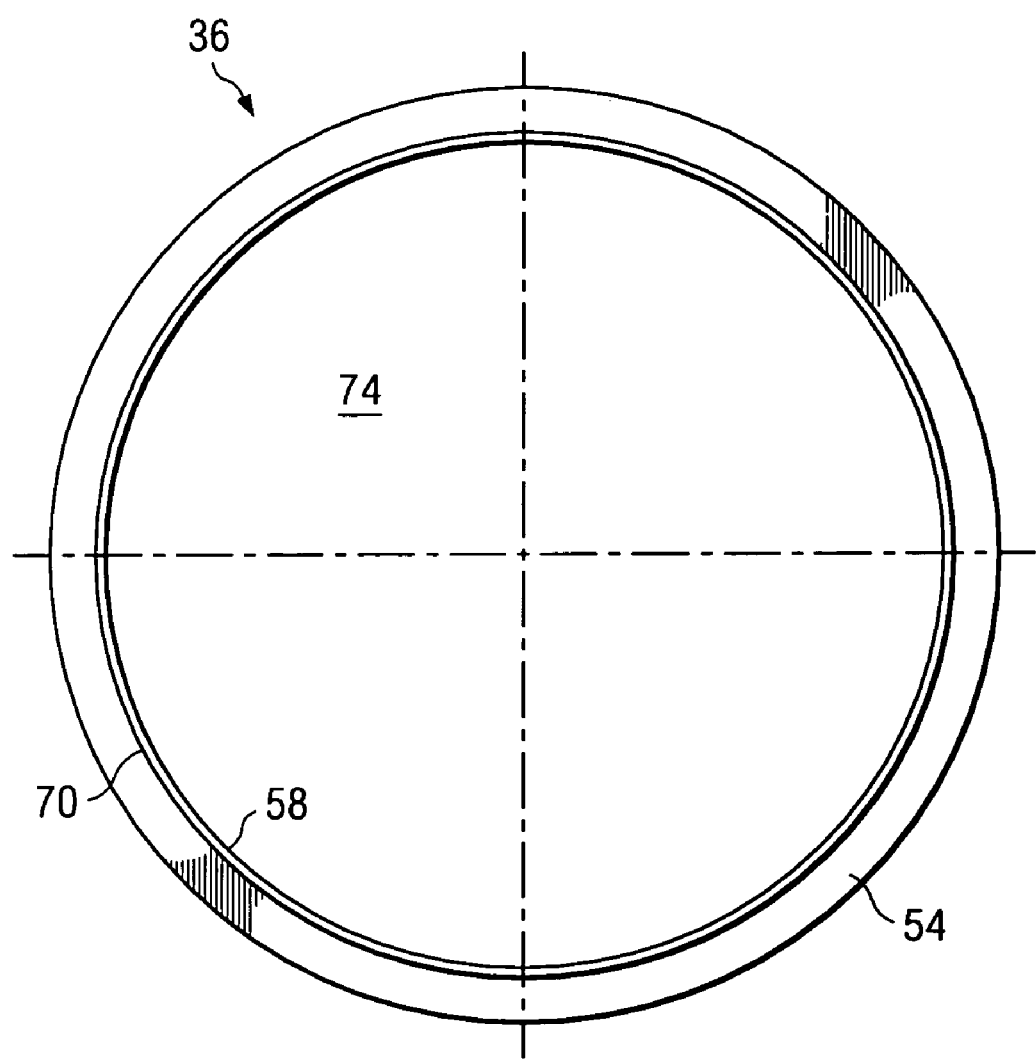
FIG. 10 is a top view of the low-friction ring.

FIG. 10 illustrates a top view of the flanged low friction ring 36 and which defines an opening 74.

Figure 11:
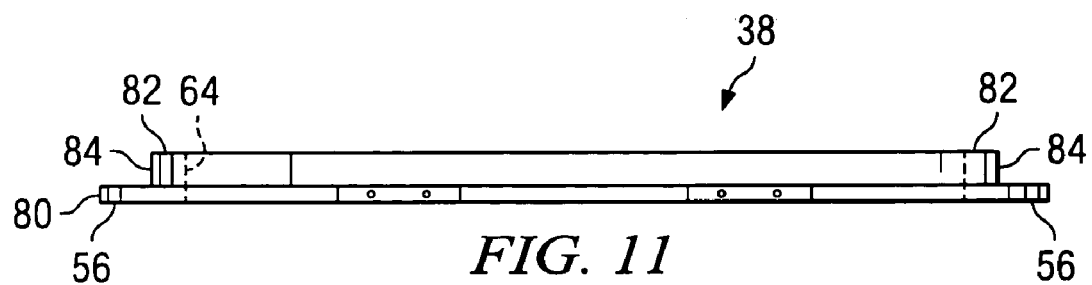
FIG. 11 is front view of the outer ring, which is adapted to encompass and receive the inner ring and low-friction ring such that the inner ring is easily rotatable therewithin.

Referring now to FIG. 11, there is shown a front view of the outer ring 38 having a radial flanged portion 80 and a vertical side wall portion 82. The flanged portion 80 defines the upper support surface 56 and the portion 82 defining a sidewall surface 84. Also shown at 84 is the notch cutout for placement of the handles, so that when the fixture 30 is assembled the bottom plane of the assembly is flat. As depicted in FIG. 11, the surface 56 and in inner annulas surface 64 receive the downwardly positioned inner low-friction ring 36, whereby annular member 62 is received therewithin.

Figure 12:
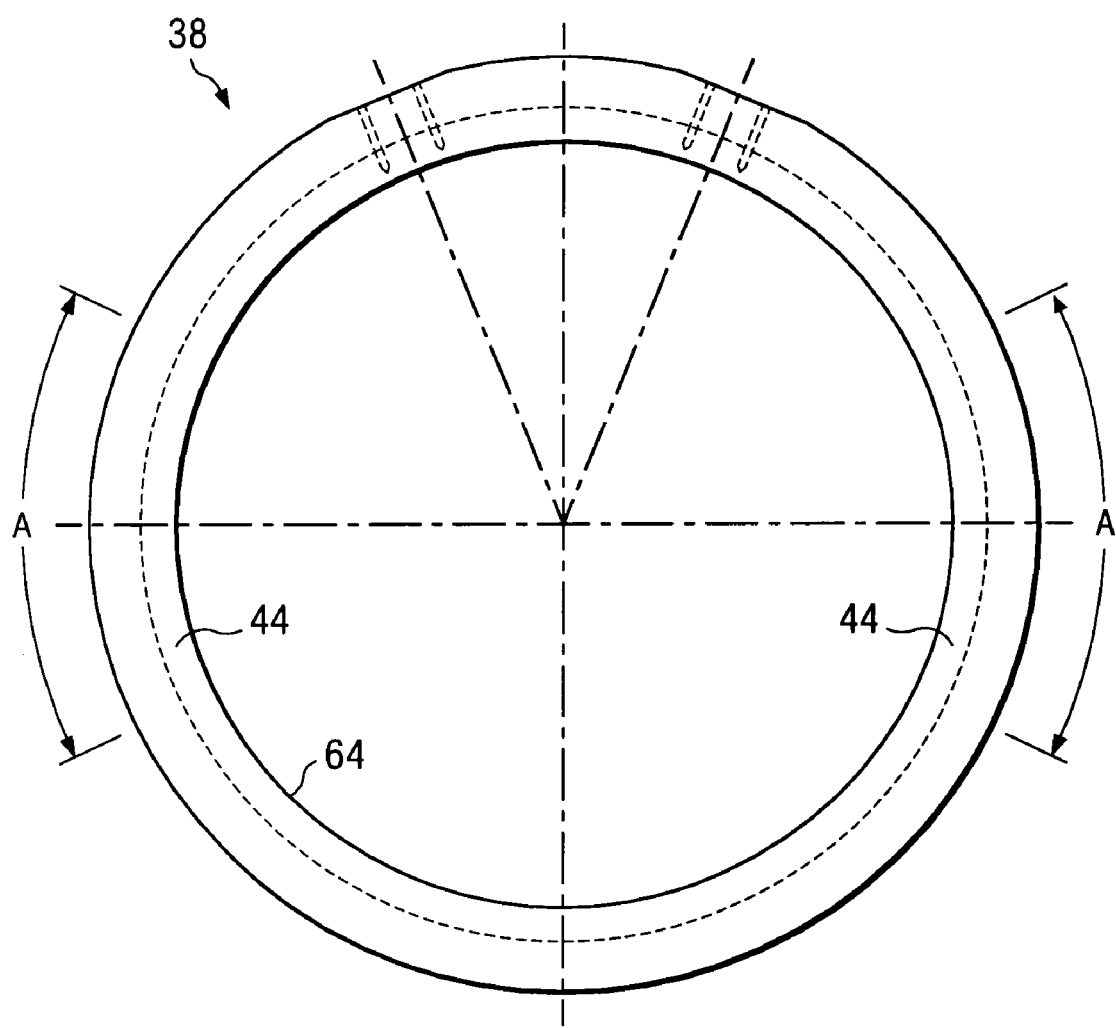
FIG. 12 is a bottom view of the outer ring.

Referring now to FIG. 12 there is shown a bottom view of the outer ring 38 depicting the pair of arcuately extending slots 44 extending an arcuate distance A. As shown and discussed with regards to FIG. 2 and FIG. 3, the slots 44 permit the extension of the radially extending handles 42 therethrough and therealong to permit the rotation of the inner ring 34 to allow the unlocking and locking of the liner 14 from the vertical furnace side wall 12. Preferably, this arcuate distance is preferably 52.45°.

Referring now to FIG. 13, there is shown a top view of one handle 42 having a pair of openings 90 permitting the extension of threaded fasteners (not shown) into the corresponding threaded recesses 66 of the inner ring bottom surface, as depicted in FIG. 8. Preferably, these openings 90 are separated an arcuate distance of 14° to separate the torque moments along the rim of the inner ring 34 to prevent damage thereto. Handle 42 is seen to have a "T-shape", having laterally extending portions 92, and an elongated radially extending portion 94. Defined at the distal end of arm 94 is an opening 96 adapted to receive a tool to apply a moment of force thereat and thereby rotate the inner ring 34 within the outer ring 38. Openings 90 and 96 are intentionally designed to be spaced in a "T" arrangement, whereby the distance of the outer opening 96 is at least double the distance between the openings 90. The opening is designed to allow a tool or handle to be inserted for additional leverage, if required.

Referring to FIG. 14, there is shown a side view of the handle 42.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications. For instance, with a slight modification, the outer ring could be designed to support the liner and rotate with respect to the inner ring whereby the elevator would support the inner ring.

We claim:

1. A method of performing a liner change from an operating heated semiconductor furnace, comprising:
   removing a heated liner from the operating heated furnace with a fixture by:
      supporting the heated liner with a first ring and a second ring of said fixture, wherein the second ring is coupled to the first ring;
      rotating the second ring between a locked position when the liner is elevated into the operating furnace and an unlocked position when the liner is lowered from the operating furnace; and
      during said rotating step, facilitating the rotation of said second ring using a low-friction member interfaced between the first ring and the second ring;
   inserting a replacement liner into the operating heated furnace.

2. The method as specified in claim 1 wherein the first ring is an outer ring, and the second ring is an inner ring.

3. The method as specified in claim 2 wherein the inner ring at least partially resides in the outer ring.

4. The method as specified in claim 1 further comprising the step of using an elevator adapted to support the first ring and elevate the liner into the operating furnace, and lower the liner from the operating furnace.

5. The method as specified in claim 4 wherein the second ring further comprises at least one radially extending handle adapted to facilitate rotation of the second ring with respect to the first ring along the low-friction member.

6. The method as specified in claim 5 wherein the handles have at least two securing points coupling the handles to the second ring, the two securing points being separated a predetermined arcuate distance.

7. The method as specified in claim 6 wherein the handles each have a lever point radially separated from the second ring along an axis extending between the two securing points to form a "T" relationship relative to the two securing points.

8. The method as specified in claim 7 wherein the two securing points are separated an arcuate distance of at least 14 degrees.

9. The method as specified in claim 4 wherein the elevator lowers the liner from the heated operating furnace at a rate below a predetermined maximum rate to control the rate of temperature change of the hot liner when removed from the heated furnace.

10. The method as specified in claim 9 wherein the predetermined maximum rate is 50 mm/min.

11. The method as specified in claim 4 wherein the elevator elevates the liner into the heated operating furnace at a rate below a predetermined maximum rate to control the rate of temperature change of the liner when inserted into the heated furnace.

12. The method as specified in claim 11 wherein the predetermined maximum rate is 50 mm/min.

13. The method as specified in claim 1 wherein the low-friction member has a flanged rim extending over the first ring.

* * * * *